US007473478B2

United States Patent
Sbiaa et al.

(10) Patent No.: US 7,473,478 B2
(45) Date of Patent: Jan. 6, 2009

(54) OSCILLATOR

(75) Inventors: Rachid Sbiaa, Tokyo (JP); Isamu Sato, Tokyo (JP); Haruyuki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 580 days.

(21) Appl. No.: 11/320,821

(22) Filed: Dec. 30, 2005

(65) Prior Publication Data

US 2007/0176519 A1 Aug. 2, 2007

(51) Int. Cl.
*G11B 5/39* (2006.01)
*H01L 41/00* (2006.01)
(52) U.S. Cl. ............ 428/693.1; 428/811; 365/171
(58) Field of Classification Search .......... None
See application file for complete search history.

(56) References Cited

U.S. PATENT DOCUMENTS

| 5,134,371 | A | * | 7/1992 | Watanabe et al. | ........ 324/252 |
| 6,166,539 | A | * | 12/2000 | Dahlberg et al. | ........ 324/252 |
| 6,183,889 | B1 | * | 2/2001 | Koshiba et al. | ........ 428/812 |
| 2005/0023938 | A1 | | 2/2005 | Sato et al. | |
| 2005/0219771 | A1 | * | 10/2005 | Sato et al. | ........ 360/324.2 |
| 2007/0236105 | A1 | * | 10/2007 | Mancoff et al. | ........ 310/363 |

FOREIGN PATENT DOCUMENTS

JP A 2005-025831 1/2005

OTHER PUBLICATIONS

Kiselev et al., "Microwave Oscillations of a Nanomagnet Driven by a Spin-Polarized Current," Nature, vol. 425, pp. 380-383, Sep. 25, 2003.

* cited by examiner

*Primary Examiner*—Kevin M Bernatz
(74) *Attorney, Agent, or Firm*—Oliff & Berridge, PLC

(57) ABSTRACT

A compact oscillator in which the oscillation frequency can be adjusted to a desired value is provided. The oscillator includes: a magnetoresistive effect element comprising a pinned layer, a nonmagnetic spacer layer, and a free layer of which magnetization direction is changeable that are stacked in that order, a magnetization direction of the pinned layer being substantially fixed along a direction perpendicular to a stack direction; a bias magnetic field application unit for applying a bias magnetic field to the free layer in a direction that is perpendicular to the stack direction and is different from the magnetization direction of the pinned layer; and an adjusting magnetic field application unit for applying an adjusting magnetic field to the free layer in a direction that is perpendicular to the stack direction and is different from the direction of the bias magnetic field.

19 Claims, 4 Drawing Sheets

OSCILLATOR

BACKGROUND OF THE INVENTION

1. Field of the Invention

The present invention relates to an oscillator used for communication of information of an electronic tag and in high-speed signal processing, for example.

2. Description of the Related Art

Microwaves are conventionally used for communication, heating, high-speed signal processing, and the like. In recent years, needs for a compact oscillator that transmits an electromagnetic wave have been increased in various applications. For example, it is expected that a compact oscillator having a size of 100 nm or less will be used for communication of information of an electronic tag or the like.

As an example of the compact oscillator which includes a ferromagnetic pinned layer whose magnetization direction is fixed, a nonmagnetic conductive layer, and a magnetic free layer whose magnetization direction is changeable stacked in that order is known (see, Japanese Patent Laid-Open Publication No. 2005-25831, for example). In this structure the magnetization direction of the free layer with low coercivity oscillates due to spin transfer effect (see, S. I. Kiselev et al., "microwave oscillations of a nanomagnet driven by a spin-polarized current", Nature, Vol. 425, 380-383 (2003), for example).

However, it is difficult to adjust the oscillation frequency to a desired values in the aforementioned compact oscillator.

SUMMARY OF THE INVENTION

In view of the foregoing problems, various exemplary embodiments of the invention provide a compact oscillator in which the oscillation frequency can be adjusted to a desired value.

According to various exemplary embodiments of the present invention, a spin waves oscillator includes: a magnetoresistive effect element including a pinned layer, a nonmagnetic spacer layer, and a free layer of which magnetization direction is changeable under magnetic field that are stacked in that order, a magnetization direction of the pinned layer being substantially fixed along a direction perpendicular to the stack direction; a bias magnetic field application unit for applying a bias magnetic field to the free layer in a direction that is perpendicular to the stack direction and is different from the magnetization direction of the pinned layer; and an adjusting magnetic field application unit for applying an adjusting magnetic field to the free layer in a direction that is perpendicular to the stack direction and is different from the direction of the bias magnetic field.

It is possible to adjust an oscillation frequency of this oscillator by changing the magnitude of the adjusting magnetic field to larger or smaller values.

Accordingly, various exemplary embodiments of the invention provide an oscillator comprising:

a magnetoresistive effect element including a pinned layer, a nonmagnetic spacer layer, and a free layer which magnetization direction is changeable that are stacked in that order, a magnetization direction of the pinned layer being substantially fixed along a direction perpendicular to a stack direction in which these layers are stacked;

a bias magnetic field application unit for applying a bias magnetic field to the free layer in a direction that is perpendicular to the stack direction and is different from the magnetization direction of the pinned layer; and an adjusting magnetic field application unit for applying an adjusting magnetic field to the free layer in a direction that is perpendicular to the stack direction and is different from the direction of the bias magnetic field.

It is possible to adjust the oscillation frequency by changing the magnitude of the adjusting magnetic field to larger or smaller values in this oscillator.

DETAILED DESCRIPTION OF THE PREFERRED EMBODIMENTS

Figure 1:
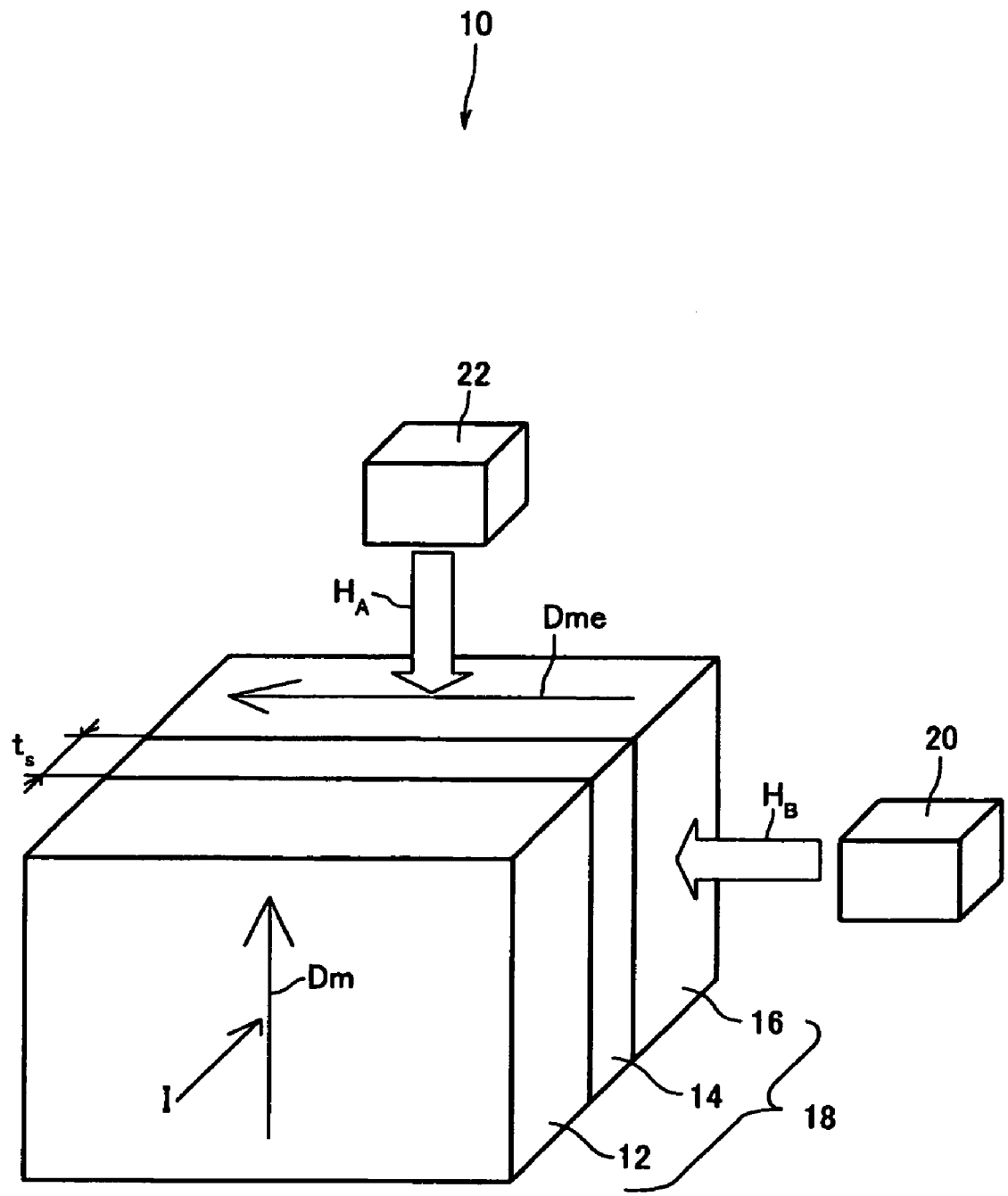
FIG. 1 is a perspective view schematically showing a structure of an oscillator according to an exemplary embodiment of the present invention.

As shown in FIG. 1, an oscillator 10 according to an exemplary embodiment of the present invention includes a magnetoresistive effect element 18, a bias magnetic field application unit 20, and an adjusting magnetic field application unit 22. The magnetoresistive effect element 18 includes a pinned layer 12, a nonmagnetic spacer layer 14, and a free layer 16 of which magnetization direction is changeable under an external magnetic field, which are stacked in that order. A magnetization direction Dm of the pinned layer 12 is substantially fixed along a direction perpendicular to a stack direction. The bias magnetic field application unit 20 is configured to apply a bias magnetic field to the free layer 16 in a direction that is perpendicular to the stack direction and is different from the magnetization direction Dm of the pinned layer 12. The adjusting magnetic field application unit 22 is configured to apply an adjusting magnetic field to the free layer 16 in a direction that is perpendicular to the stack direction and is different from the direction of the bias magnetic field.

The pinned layer 12 is made of ferromagnetic material. A magnetization direction of the pinned layer 12 is substantially fixed in a direction perpendicular to the stack direction. Exemplary structures of the pinned layer 12 include a single-layer structure consisting of a single ferromagnetic layer, a synthetic structure (that is formed by at least two ferromagnetic layers that are coupled antiferromagnetically to each other while those ferromagnetic layers are separated from each other by a nonmagnetic spacer of Ru, Rh, Ir, Cr, Cu, or the like), and a multilayer structure including two or more ferromagnetic layers, e.g., CoFe/NiFe. It is preferable that the ferromagnetic layer portion have a single-layer structure. A ferromagnetic layer represented by "CoFe/NiFe" means a bi-layer structure in which a CoFe layer portion substantially formed of Co and Fe and a NiFe layer portion substantially formed of Ni and Fe are stacked.

Examples of a material for the ferromagnetic layer include CoFe, CoFeB, NiFe, CoNi, CoFeNi, CoMnAl, NiMnSb, materials substantially composed of Co, Cr, Fe, and Al such as $Co_2Cr_{0.6}Fe_{0.4}Al$, materials substantially composed of Co, Cr, and Al such as $Co_2Cr_{0.6}Al$, materials substantially composed of CoMnAl such as $Co_2MnAl$, materials substantially composed of Co, Fe, and Al such as $Co_2FeAl$, and materials substantially composed of Co, Mn, and Ge such as $Co_2MnGe$ or the like. Incidentally, an antiferromagnetic layer may be provided to fix the magnetization direction of the pinned layer 12 in contact with the pinned layer 12 if necessary. Examples of a material for the antiferromagnetic layer pinclude alloys containing Mn, for example PtMn, IrMn, FeMn or PtPdMn.

Metals and insulating materials can be used as a material for the spacer layer 14. Exemplary metals include Cu, Ag, Au, Cr, and materials containing at least one of those elements. Exemplary insulating materials include $Al_2O_3$, $TiO_2$, and MgO.

When using a metal, it is preferable that a thickness $t_s$(nm) of the spacer layer 14 is 1.5 or more for forming uniform spacer layer 14 without defect. On the other hand, it is preferable that a thickness $t_s$ (nm) of the spacer layer 14 is 4 or less to obtain high MR ratio.

When using an insulating material, it is preferable that the thickness $t_s$ (nm) of the spacer layer 14 is 0.5 or more for forming uniform spacer layer 14 without defect to obtain high MR ratio. On the other hand, it is preferable that a thickness $t_s$ (nm) of the spacer layer 14 is 1.5 or less to suppress the resistance in a small and good value.

The same material as the magnetic material forming the pinned layer 12 can be used as a material for the free layer 16. An easy axis of magnetization direction Dme of the free layer 16 is set to be perpendicular to both the stack direction and the magnetization direction Dm of the pinned layer 12 by the bias magnetic field. It is preferable that the free layer 16 have a single-layer structure.

The bias magnetic field application unit 20 is composed of permanent magnet, or the like, and is arranged to apply a bias magnetic field to the free layer 16 in a direction perpendicular to the magnetization direction Dm of the pinned layer 12.

The adjusting magnetic field application unit 22 is composed of a permanent magnet, for example, and is arranged to apply a magnetic field to the free layer 16 in the opposite direction to the magnetization direction Dm of the pinned layer 12. The adjusting magnetic field application unit 22 is configured in such a manner that the magnitude of the adjusting magnetic field $H_A$ applied to the free layer 16 is changeable.

Next, an operation of the oscillator 10 is described.

A current is supplied to the magnetoresistive effect element 18 of the oscillator 10 so as to flow along the stack direction in the magnetoresistive effect element 18. When the electrons cross the pinned layer 12, the majority of electrons become polarized in the same direction as the magnetization direction Dm of the pinned layer 12.

When an adjusting magnetic field is applied to the free layer 16, the magnetization direction of the free layer 16 is changed in accordance with the magnitude of the adjusting magnetic field $H_A$. The resistance of the magnetoresistive effect element 18 varies as a function of an angle formed between the magnetization direction of the free layer 16 and magnetization direction Dm of the pinned layer 12. As the magnetization direction of the free layer 16 becomes closer to that of the pinned layer 12, the resistance value of the magnetoresistive effect element 18 becomes smaller. On the other hand, as the magnetization direction of the free layer 16 becomes closer to a direction that is opposite (anti-parallel) to the magnetization direction of the pinned layer 12, the resistance value of the magnetoresistive effect element 18 becomes larger.

It is considered that when polarized electrons traverse the free layer 16, a part of their spin angular momentum is transferred to the free layer 16. This effect called spin transfer causes a fluctuation of the magnetization direction of the free layer 16. Therefore, the magnetoresistive effect element 18 oscillates.

An oscillation frequency of the magnetoresistive effect element 18 changes in accordance with the magnitude of the adjusting magnetic field $H_A$. More specifically, the oscillation frequency becomes higher as the magnitude of the adjusting magnetic field $H_A$ becomes larger. That is, it is possible to adjust the oscillation frequency of the oscillator 10 by changing the magnitude of the magnetic field $H_A$. When at least one of the adjusting magnetic field $H_A$ and the bias magnetic field $H_B$ is zero, the magnetization direction of the free layer 16 finishes without clear oscillation.

When the magnetoresistive effect element 18 has a small size with the minimum width in a direction perpendicular to the stack direction of about 100 nm or less, for example, the spin-transfer effect becomes large. Therefore, large magnetization oscillation amplitude can be achieved. In other words, the magnetoresistive effect element 18 of the present exemplary embodiment is suitable for a compact oscillator having a size that the minimum width in the direction perpendicular to the stack direction is about 100 nm or less, for example.

Incidentally, the magnetization direction of the free layer 16 cannot change easily, when the magnitude $H_A$ (Oe) of the adjusting magnetic field is excessively large. According to a certain simulation, it is preferable that the magnitude $H_A$ (Oe) is 250 or less for easy change of the magnetization direction of the free layer 16.

The free layer 16 has mono-domain structure and barkhausen noise is suppressed when magnitude of $H_B$ is 100 (Oe) or more. On the other hand, the magnetization direction of free layer 16 can rotate according to the direction of the adjusting magnetic field.

Therefore, it is preferable that the magnitude $H_B$ (Oe) of the bias magnetic field be in a range of $100 \leq H_B \leq 300$.

In the present exemplary embodiment, the oscillator 10 has a structure in which the direction of the adjusting magnetic field applied to the free layer 16 by the adjusting magnetic field application unit 22 is parallel to the magnetization direction Dm of the pinned layer 12. However, the adjusting magnetic field application unit 22 may be configured in such a manner that the direction of the adjusting magnetic field applied to the free layer 16 is at an angle with respect to a direction parallel to the magnetization direction Dm of the pinned layer 12, as long as the direction of the adjusting magnetic field is perpendicular to the stack direction in which the pinned layer 12, the spacer layer 14, and the free layer 16 are stacked and is different from the direction of the bias magnetic field.

Moreover, in the present exemplary embodiment, the oscillator 10 has a structure in which the direction of the bias magnetic field applied to the free layer 16 by the bias magnetic field application unit 20 is perpendicular to the magnetization direction Dm of the pinned layer 12. However, the direction of the bias magnetic field applied to the free layer 16 may be at an angle slightly with respect to a direction perpendicular to the magnetization direction Dm of the pinned layer 12, as long as the direction of the bias magnetic field is perpendicular to the stacked direction and is different from the magnetization direction Dm of the pinned layer 12. Though the oscillator 10 doesn't comprise the substrate in this exemplary embodiment, the pinned layer 12, the spacer layer 14, and a free layer 16 are actually formed over the substrate. The substrate may be arranged on the pinned layer 12 side. Alternatively, the substrate may be arranged on the free layer 16 side.

[Simulation Example]

Simulation was performed for the oscillator 10 of the above exemplary embodiment under the following conditions in order to calculate oscillation characteristics with respect to the magnitude $H_A$ (Oe) of the adjusting magnetic field.

Magnitude $H_A$ of adjusting magnetic field: 0 to 300 (Oe)
Magnitude $H_B$ of bias magnetic field: 250 (Oe)
Supplied current: 5 (mA)
Cross-sectional shape of the magnetoresistive effect element 18 (shape of a cross-section perpendicular to the stack direction): Rectangular shape
Length of a shorter side of the above cross-section: 60 (nm)
Length of a longer side of the above cross-section: 80 (nm)
Thickness of the pinned layer 12:3 (nm)
Saturation magnetization in the pinned layer 12:700 (emu/cm$^3$)
Thickness of the free layer 16:3 (nm)
Anisotropy energy of the free layer 16:5.10$^4$ erg/cm$^3$
exchange stiffness of the pinned layer 12 and the free layer 16 is: 1.25 10$^{-6}$ erg/cm FIG. 2 shows a graph of a relationship between the magnitude $H_A$ (Oe) of the adjusting magnetic field and the oscillation frequency (GHz).

Figure 2:
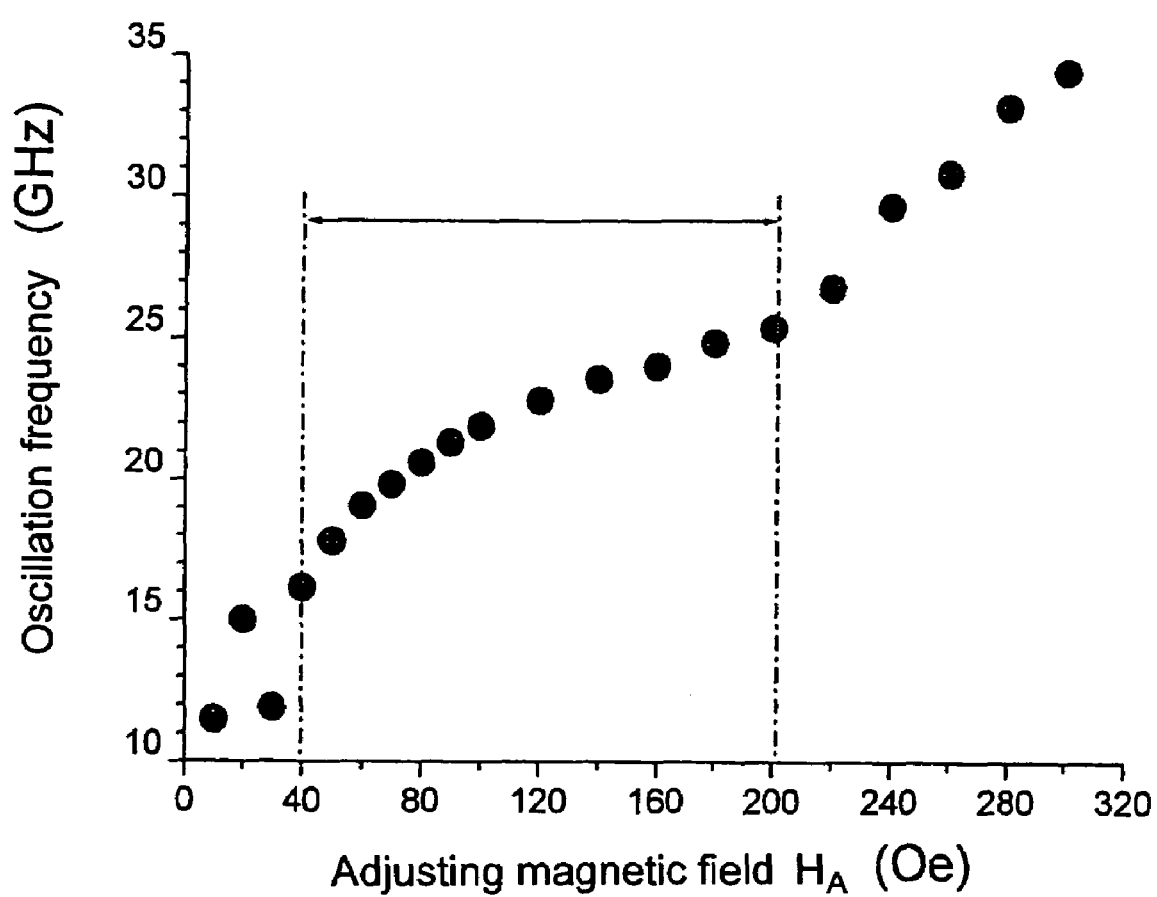
FIG. 2 is a graph showing a relationship between magnitude of an adjusting magnetic field and an oscillation frequency in the simulation example of the present invention.

As shown in FIG. 2, the oscillation frequency tends to become higher as the magnitude $H_A$ (Oe) of the adjusting magnetic field becomes larger. Moreover, when the magnitude $H_A$ (Oe) of the adjusting magnetic field is smaller than 40 (Oe), the oscillation frequency value does not change regularly and does not monotonously increase with increase of the magnitude $H_A$ (Oe) of the adjusting magnetic field. Therefore, it is preferable that the magnitude $H_A$ (Oe) of the adjusting magnetic field be equal to or larger than 40 in order to ensure oscillation with stable frequency.

Figure 3:
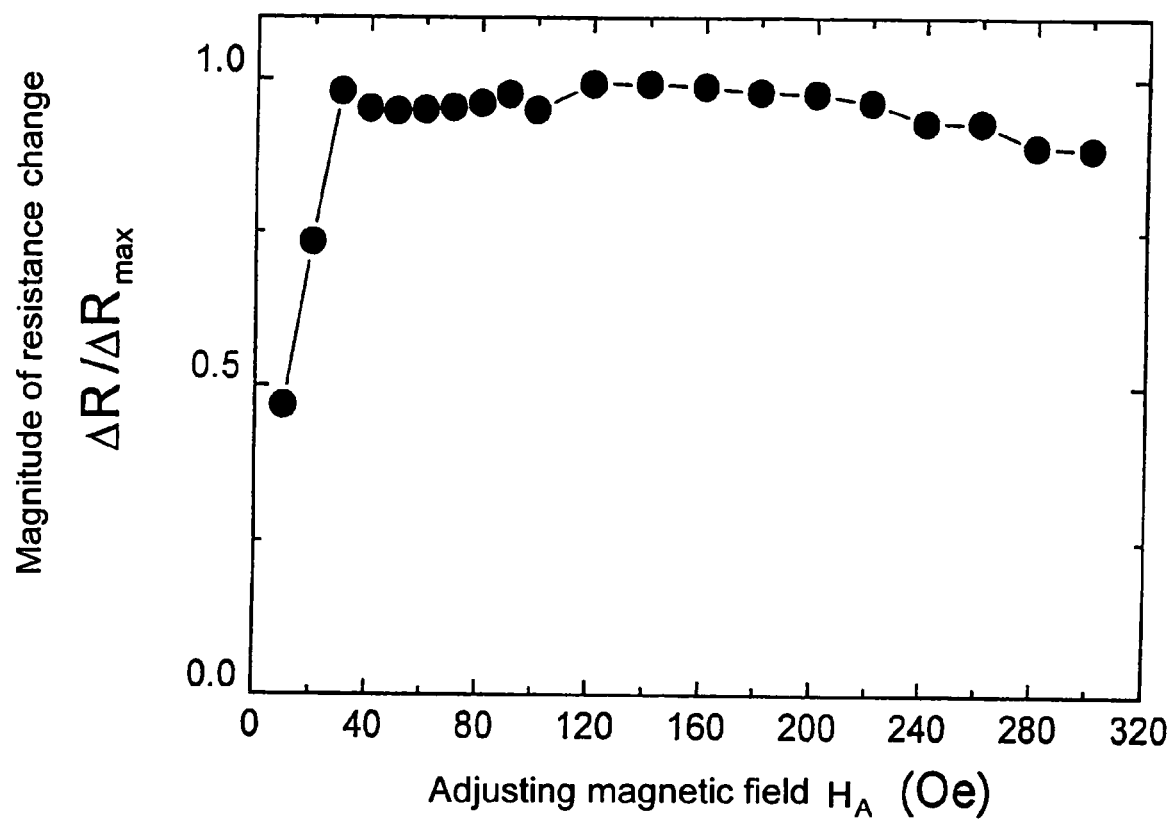
FIG. 3 is a graph showing a relationship between the magnitude of the adjusting magnetic field and magnitude of a resistance change in a magnetoresistive effect element in the same simulation example.

FIG. 3 shows a graph of a relationship between the magnitude $H_A$ (Oe) of the adjusting magnetic field and the normalized value of resistance change in the magnetoresistive effect element 18. $\Delta R_{max}$ is the maximum value of resistance change obtained when the magnetization direction of the free layer 16 rotates from parallel position to antiparallel position to the magnetization direction Dm of the pinned layer 12.

As shown in FIG. 3, the value of the resistance change is stable when the magnitude $H_A$ (Oe) of the adjusting magnetic field is in a range of $40 \leq H_A \leq 200$. However, when the magnitude $H_A$ of the adjusting magnetic field is smaller than 40 (Oe), the value of the resistance change rapidly decreases. That is, oscillation amplitude falls rapidly. Moreover, when $H_A$ is larger than 200 (Oe), the value of the resistance change gradually decreases. Therefore, it is preferable that the magnitude $H_A$ (Oe) of the adjusting magnetic field be in a range of $40 \leq H_A \leq 200$ in order to achieve oscillation with stable strength.

Figure 4:
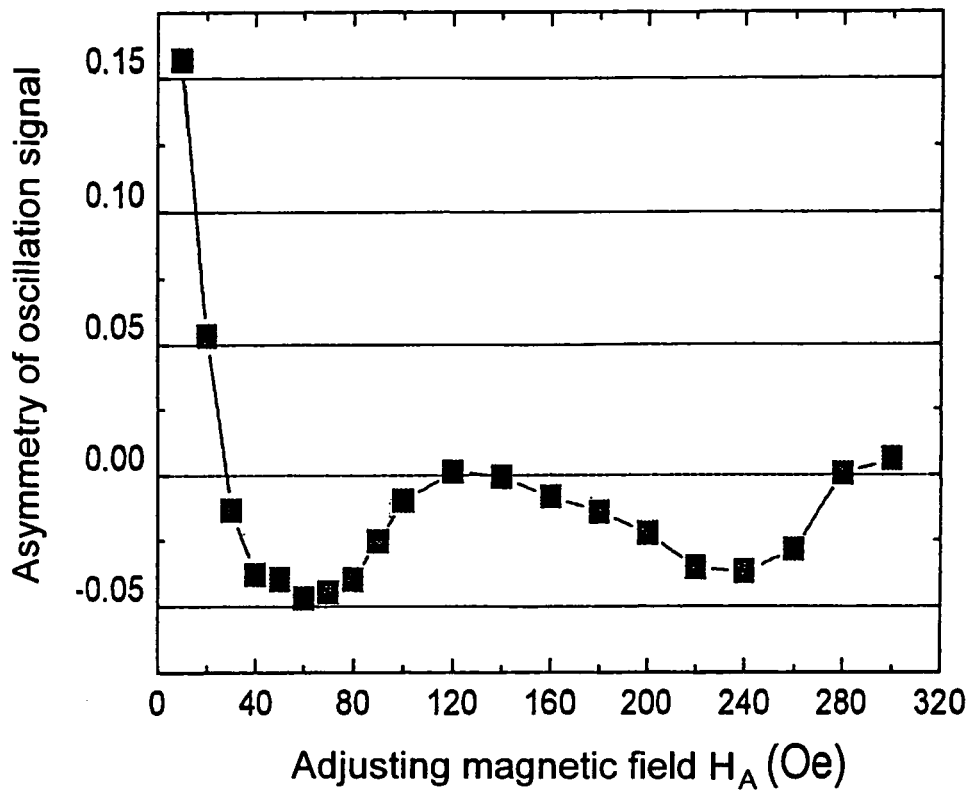
FIG. 4 is a graph showing a relationship between the magnitude of the adjusting magnetic field and degree of asymmetry of oscillation signal of the free layer magnetization.
Figure 5:
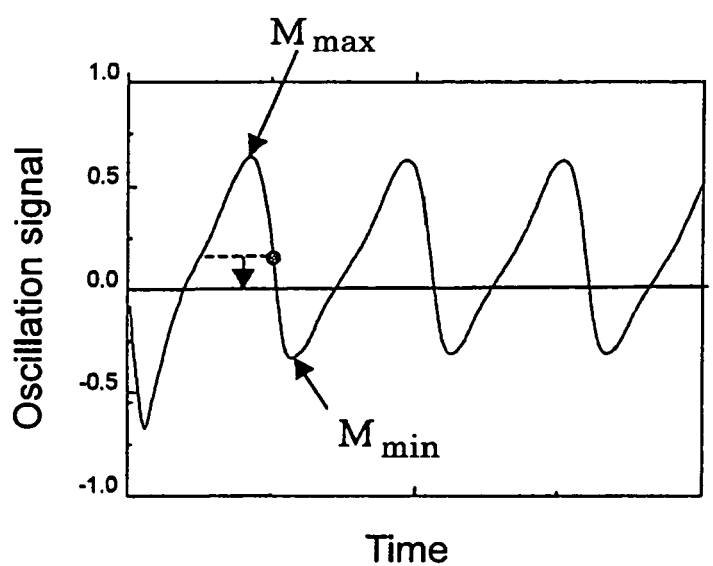
FIG. 5 is a graph describing meaning of the degree of asymmetry of oscillation signal plotted in FIG. 4.

FIG. 4 shows a graph of a relationship between the magnitude $H_A$ (Oe) of the adjusting magnetic field and the degree of asymmetry of the oscillation signal of the magnetization of the free layer 16. The asymmetry of the oscillation signal means the difference between an absolute value of maximum magnetization and an absolute value of minimum magnetization of the free layer 16, as shown in FIG. 5. For example, oscillation of the free layer magnetization is symmetrical when an absolute value of the positive amplitude is equal to an absolute value of the negative amplitude.

As shown in FIG. 4, the degree of asymmetry of the oscillation signal of the magnetization of the free layer 16 is stable around zero in the case where the magnitude $H_A$ (Oe) of the adjusting magnetic field is in a range of $100 \leq H_A \leq 160$. That is, it is preferable that the magnitude $H_A$ (Oe) of the adjusting magnetic field be in a range of $100 \leq H_A \leq 160$ in order to obtain symmetrical oscillation of the magnetic field.

The present invention can be used for communication of information of an electronic tag and high-speed signal processing for example.

What is claimed is:

1. An oscillator comprising:
   a magnetoresistive effect element including a pinned layer, a nonmagnetic spacer layer, and a free layer of which magnetization direction is changeable that are stacked in that order, a magnetization direction of the pinned layer being substantially fixed along a direction perpendicular to a stack direction in which these layers are stacked;
   a bias magnetic field application unit for applying a bias magnetic field to the free layer in a direction that is perpendicular to the stack direction and is different from the magnetization direction of the pinned layer; and
   an adjusting magnetic field application unit for applying an adjusting magnetic field to the free layer in a direction that is perpendicular to the stack direction and is different from the direction of the bias magnetic field.

2. The oscillator according to claim 1, wherein
the bias magnetic field application unit applies the bias magnetic field to the free layer in a direction perpendicular to the magnetization direction of the pinned layer.

3. The oscillator according to claim 1, wherein
the adjusting magnetic field application unit applies the adjusting magnetic field to the free layer in a direction parallel to the magnetization direction of the pinned layer.

4. The oscillator according to claim 2, wherein
the adjusting magnetic field application unit applies the adjusting magnetic field to the free layer in a direction parallel to the magnetization direction of the pinned layer.

5. The oscillator according to claim 1, wherein
a magnitude $H_B$ (Oe) of the bias magnetic fieled applied by the bias magnetic field application unit to the free layer is in a range of $100 \leq H_B \leq 300$.

6. The oscillator according to claim 2, wherein
a magnitude $H_B$ (Oe) of the bias magnetic fieled applied by the bias magnetic field application unit to the free layer is in a range of $100 \leq H_B \leq 300$.

7. The oscillator according to claim 3, wherein
a magnitude $H_B$ (Oe) of the bias magnetic fieled applied by the bias magnetic field application unit to the free layer is in a range of $100 \leq H_B \leq 300$.

8. The oscillator according to claim 1, wherein
a magnitude $H_A$ (Oe) of the adjusting magnetic field applied by the adjusting magnetic field application unit to the free layer is in a range of $40 \leq H_A \leq 250$.

9. The oscillator according to claim 2, wherein
a magnitude $H_A$ (Oe) of the adjusting magnetic field applied by the adjusting magnetic field application unit to the free layer is in a range of $40 \leq H_A \leq 250$.

10. The oscillator according to claim 3, wherein
a magnitude $H_A$ (Oe) of the adjusting magnetic field applied by the adjusting magnetic field application unit to the free layer is in a range of $40 \leq H_A \leq 250$.

11. The oscillator according to claim 5, wherein
a magnitude $H_A$ (Oe) of the adjusting magnetic field applied by the adjusting magnetic field application unit to the free layer is in a range of $40 \leq H_A \leq 250$.

12. The oscillator according to claim 1, wherein the spacer layer is formed of a metal material and has a thickness $t_s$ in a range of 1.5 nm $\leq t_s \leq$ 4 nm.

13. The oscillator according to claim 2, wherein the spacer layer is formed of a metal material and has a thickness $t_s$ in a range of 1.5 nm $\leq t_s \leq$ 4 nm.

14. The oscillator according to claim 3, wherein the spacer layer is formed of a metal material and has a thickness $t_s$ in a range of 1.5 nm $\leq t_s \leq$ 4 nm.

15. The oscillator according to claim 5, wherein the spacer layer is formed of a metal material and has a thickness $t_s$ in a range of 1.5 nm $\leq t_s \leq$ 4 nm.

16. The oscillator according to claim 1, wherein the spacer layer is formed of an insulating material and has a thickness $t_s$ in a range of 0.5 nm $\leq t_s \leq$ 1.5 nm.

17. The oscillator according to claim 2, wherein the spacer layer is formed of an insulating material and has a thickness $t_s$ in a range of 0.5 nm $\leq t_s \leq$ 1.5 nm.

18. The oscillator according to claim 3, wherein the spacer layer is formed of an insulating material and has a thickness $t_s$ in a range of 0.5 nm $\leq t_s \leq$ 1.5 nm.

19. The oscillator according to claim 5, wherein the spacer layer is formed of an insulating material and has a thickness $t_s$ in a range of 0.5 nm $\leq t_s \leq$ 1.5 nm.

* * * * *